United States Patent [19]
Moreaux

[11] Patent Number: 6,128,222
[45] Date of Patent: Oct. 3, 2000

[54] NON-VOLATILE MEMORIES PROGRAMMABLE BY "HOT CARRIER" TUNNEL EFFECT AND ERASABLE BY TUNNEL EFFECT

[75] Inventor: Christophe Moreaux, Aix en Provence, France

[73] Assignee: STMicroelectronics S.A., Gentilly, France

[21] Appl. No.: 09/173,136

[22] Filed: Oct. 15, 1998

[30] Foreign Application Priority Data

Oct. 15, 1997 [FR] France .................................. 97-12903

[51] Int. Cl.$^7$ ................................................. G11C 16/04
[52] U.S. Cl. ............................... 365/185.18; 365/185.23; 365/185.33
[58] Field of Search .......................... 365/185.18, 185.23, 365/185.33

[56] References Cited

U.S. PATENT DOCUMENTS

| | | |
|---|---|---|
| 4,409,723 | 10/1983 | Harari . |
| 4,630,086 | 12/1986 | Sato et al. . |
| 5,058,063 | 10/1991 | Wada et al. ..................... 365/185.18 X |
| 5,237,534 | 8/1993 | Tanaka et al. ..................... 365/185.21 |
| 5,408,431 | 4/1995 | Challa . |
| 5,706,228 | 1/1998 | Chang et al. ..................... 365/185.18 |
| 5,790,455 | 8/1998 | Caywood ..................... 365/185.27 X |
| 5,926,418 | 7/1999 | Wong ............................. 365/185.18 X |
| 5,956,270 | 9/1999 | Shimomura et al. ............. 365/185.18 |

FOREIGN PATENT DOCUMENTS

| | | |
|---|---|---|
| 0 247 875 | 12/1987 | European Pat. Off. . |
| 0 255 963 | 2/1988 | European Pat. Off. . |

OTHER PUBLICATIONS

French Search Report dated Jun. 16, 1998.

*Primary Examiner*—Huan Hoang
*Attorney, Agent, or Firm*—Theodore E. Galanthay; Stephen C. Bongini; Fleit,Kain,Gibbons,Gutman & Bongini P.L.

[57] ABSTRACT

A Flash-EPROM type memory cell with a short read time and a "very low supply voltage." The memory cell has the additional advantage of using less power, therefore generating less heat and allowing a denser integrated circuit. The memory cell comprises a floating-gate transistor whose source is coupled to the drain of a selection transistor. The floating-gate transistor is in a depleted state when the memory cell is "erased." The read voltage applied to the control gate of the floating-gate transistor is substantially equal to a general supply voltage which is in the range of 1.5 volts. The gate of the selection transistor receives a bias voltage at least equal to its conduction threshold. The gate of the selection transistor can also receive a bias voltage higher than the read voltage, which will speed up the read time further. A Flash-EPROM incorporating this memory cell is also provided.

17 Claims, 2 Drawing Sheets

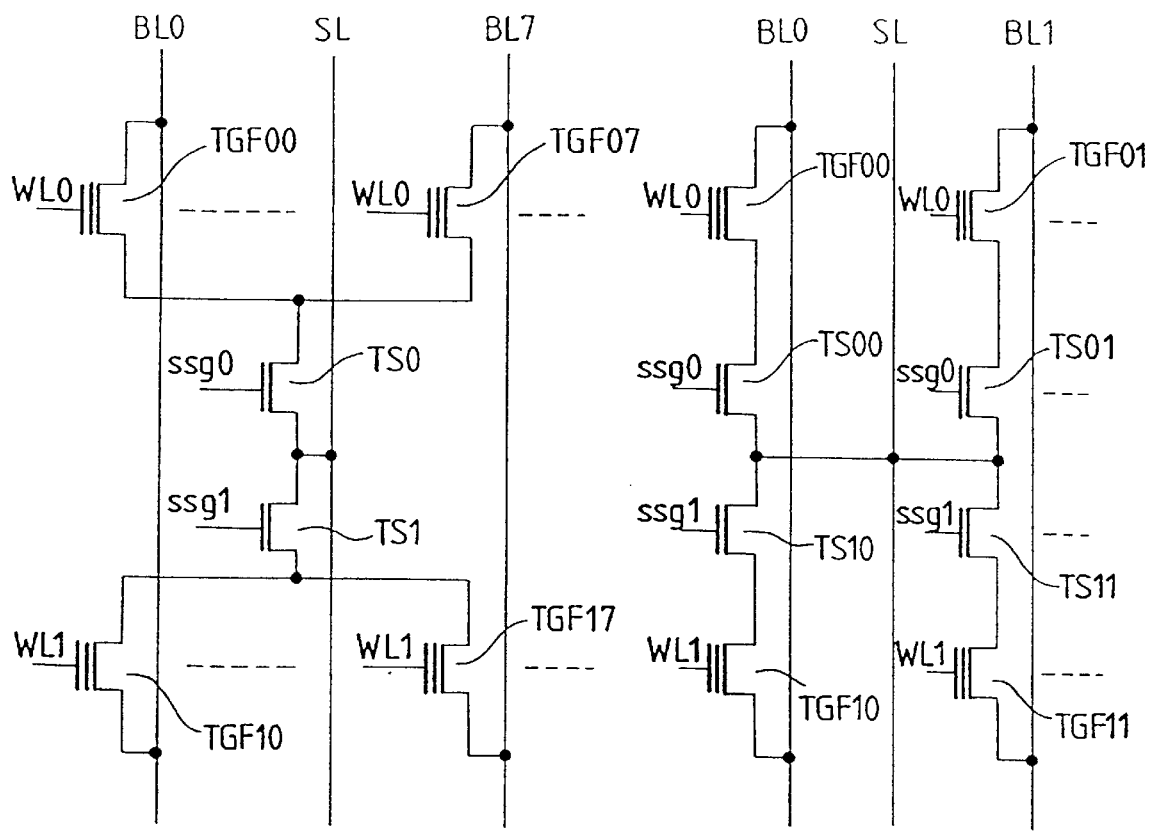
FIG_1
FIG_2
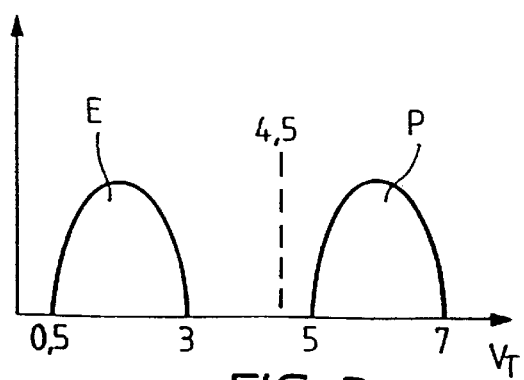
FIG_3
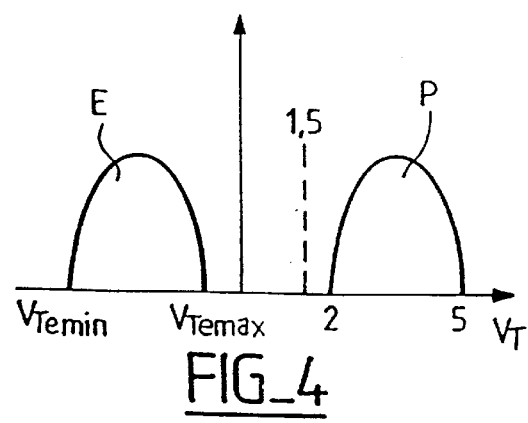
FIG_4

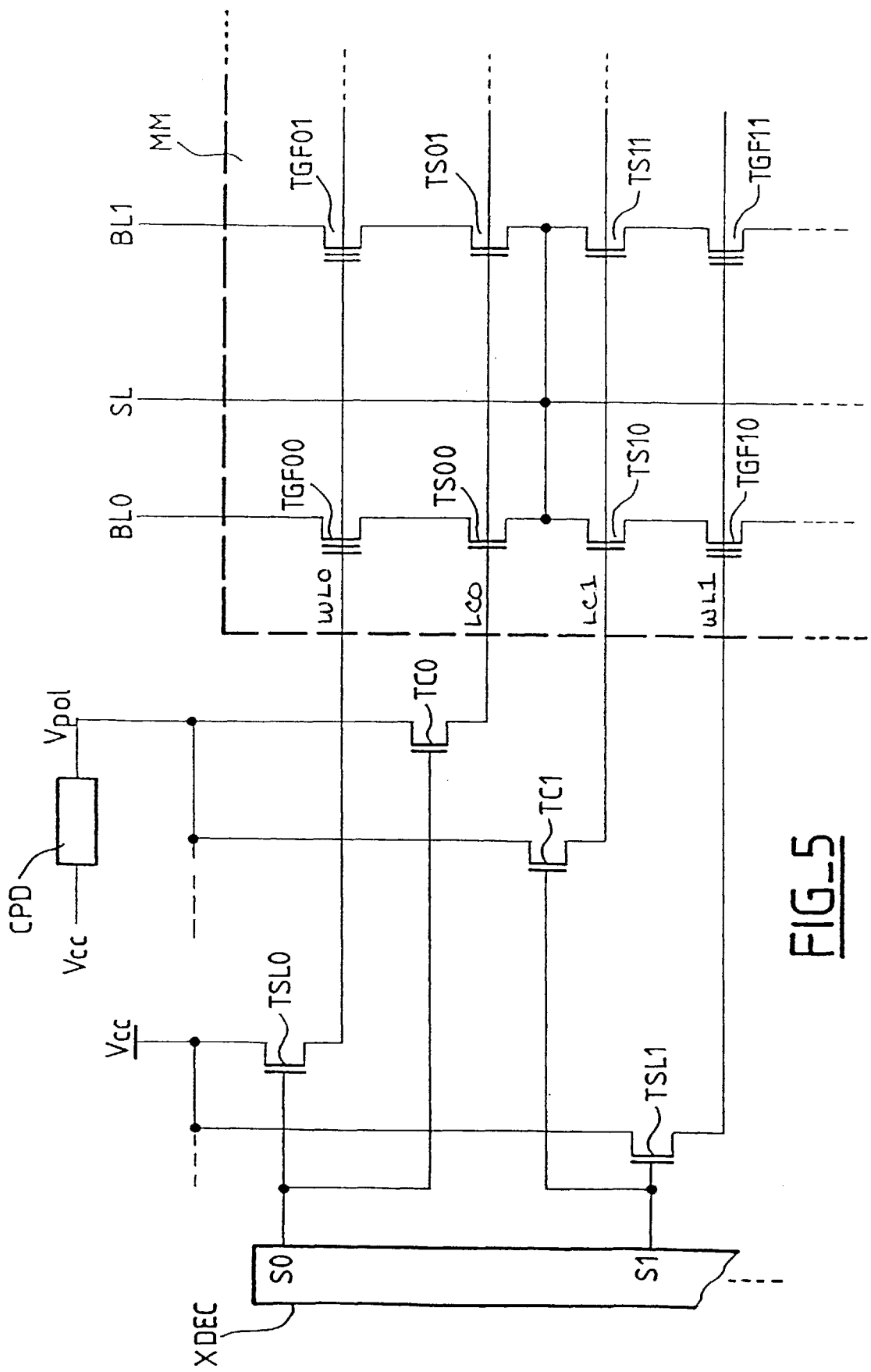
FIG_5

NON-VOLATILE MEMORIES PROGRAMMABLE BY "HOT CARRIER" TUNNEL EFFECT AND ERASABLE BY TUNNEL EFFECT

CROSS-REFERENCE TO RELATED APPLICATIONS

This application is based upon and claims the benefit of the priority of the prior French patent application 97-12903 filed on Oct. 15, 1997. the contents of which are incorporated herein by reference.

BACKGROUND OF THE INVENTION

1. Field of the Invention

The present invention relates generally to non-volatile memories in integrated circuit form which are programmable by the effect known as "hot carrier" effect and erasable by tunnel effect. More particularly, it relates to an improvement in a memory cell as well as to a memory of this type.

2. Description of Related Art

The first memories of the non-volatile type appeared under the name of EPROMs (electrically programmable read-only memories). In these memories, the memory cells comprise a floating-gate transistor that is programmable by so-called hot carrier effect. This programming consists of the application of a potential difference between the drain and the source of the transistor in the presence also of a high potential difference (of about 20 volts, this value varying according to the desired programming speed) between the control gate and the source. The application of the first of these potential differences generates an electrical field that gives rise to a flow of electrons in the channel. These electrons collide with atoms of the channel, causing the appearance of new free electrons. These electrons have very high energy (this is why the term "hot carriers" is used). The high difference in potential between the control gate and the source of the transistor gives rise to a strong electrical field between the floating gate and the substrate, the effect of which is that certain of these electrons are injected into the floating gate, thus putting the memory cell in a state known as a "programmed" state. The fact that the programming of a memory cell requires the application of voltages both to the control gate and to the drain of the floating-gate transistor eliminates the need for the use of a selection transistor to program one particular memory cell without programming the others. This results in a small surface area of silicon occupied by the memory array and therefore large-scale integration density. By contrast, the erasure of all the memory cells of the memory is done only in its totality by exposure to ultraviolet radiation. This is the essential drawback of these memories.

This is why EEPROMs (electrically erasable PROMS) made their appearance. These memories are electrically programmable and erasable by tunnel effect (Fowler Nordheim effect). The memory cells have a floating-gate transistor whose drain is connected to the bit line by means of a selection transistor. The gate of this transistor is connected to the word line. The gate of the floating-gate transistor is controlled by means of a bias transistor. The sources of the floating-gate transistors are common and generally connected to the ground. These transistors have an oxide layer between the substrate and the floating gate that is very thin (in the range of 2 to 3 nanometers) to enable the transfer of charges by tunnel effect (Fowler Nordheim effect). The advantage of EEPROMs as compared with EPROMs lies in the fact that each memory cell is programmable and erasable independently of the other memory cells. The tradeoff here is that a larger surface area of silicon is required and therefore a smaller scale of integration density.

A third type of memory has more recently made its appearance. This type comprises memories known as Flash EPROMs which combine the integration density of EPROMs with the ease of programming and erasure of EEPROMs. These memories can be programmed memory cell by memory cell using the hot carrier effect in the same way as the EPROMs. They are also erasable electrically by tunnel effect (Fowler Nordheim effect). The memory cells of a Flash EPROM memory comprise a floating-gate transistor that has an oxide layer whose thickness is greater (about 10 to 12 nm) than in the case of an EEPROM but smaller than in the case of an EPROM to enable erasure by tunnel effect. Indeed, for the erasure, a highly negative potential difference is created between the control gate and the source, the drain being left in the high impedance state or connected to the ground so that a high electrical field is created tending to remove the electrons from the floating gate.

If, in the memory array, the sources of the floating-gate transistors of each memory cell are common, it is impossible to erase just one memory cell alone. The memory can then be erased only in its totality, namely all the memory cells have to be erased at the same time. However, there are known ways of making Flash EPROM type memories that are electrically erasable by blocks of memory cells as shall be described with reference to FIG. 1. This figure shows an equivalent electrical diagram of the standard structure of a Flash EPROM type memory array. It is a partial view of a memory array organized in rows and columns, a word line (for example WL0 or WL1) being common to the memory cells of the same row (with an index 0 or 1 respectively) and a bit line (for example BL0, BL1, . . . , BL7) being common to the memory cells of the same column (with an index 0 to 7 respectively).

A floating-gate transistor forming the storage element of a memory cell is located at the intersection of each word line and each bit line. The floating-gate transistor of a memory cell located at the intersection of the row indexed i and the column indexed j of the memory array is designated in the figures by the reference TGFij. Thus, for example, FIG. 1 shows the floating-gate transistors TGF00 respectively at the intersection of the row 0 and the column 0, TGF07 at the intersection of the row 0 and the column 7, TGF10 at the intersection of the row 1 and the column 0 and TGF17 at the intersection of the row 1 and the column 7.

The control gates of the floating-gate transistors of the memory cells of a given row are connected to the corresponding word line. The drains of the floating-gate transistors of the memory cells of the same column, for example the column 0, are connected to the corresponding bit line, for example the line BL0. The sources of a block of memory cells of the same row are common and are connected to the drain of a selection transistor. For example, a block of this kind has eight adjacent memory cells that are adjacent along the axis of the rows so that a block corresponds to a word of one byte. Thus, the sources of eight adjacent floating-gate transistors TG00 to TG07 of the row 0 are connected to the drain of a selection transistor TS0. Similarly, the source of eight adjacent floating-gate transistors TGF10 to TGF17 of the row 1, which are adjacent along the axis of the columns to the transistors TGF00 to TGF07 respectively, are connected to the drain of a selection transistor TS1. The sources of the selection transistors of memory cell blocks that are adjacent along the axis of the columns (vertically in FIG. 1)

are connected to the same selection line. Thus, in FIG. 1, the sources of the transistors TS0 and TS1 are connected to the selection line SL. The selection transistors are not floating-gate transistors. They are normally enhanced transistors. The selection lines of the memory array are designed to be taken to a potential that differs depending on whether the operation performed is a programming, erasure or read operation and enables the accurate biasing of the floating-gate transistors. To this end, the memory has means for obtaining individual access to each selection line such as an adapted decoder. Furthermore, the gates of the selection transistors of the blocks of memory cells of the same row receive the same control signal, for example the signal ssg0 for the row 0 and the signal ssg1 for the row 1. These signals are also applied to the corresponding word line, for example WL0 and WL1 respectively. In read mode, these signals dictate a potential ranging between the conduction threshold of a transistor in the "erased" state and that of a transistor in the "programmed" state for the selected memory cells (namely those of the selected row) and a zero potential (namely the ground potential) for the memory cells that are not selected (namely those of the other rows).

It will be noted that two floating-gate transistors that are adjacent along the axis of the columns share their drains. Similarly, the selection transistors of two blocks of adjacent memory cells along the axis of the columns share their sources. Thus, space is saved on the silicon substrate.

The standard structure illustrated here above of memories using Flash EPROM technology makes it possible to design a memory with an integration density close to that of the EPROM type memories while at the same time offering a function of erasure by tunnel effect for blocks of memory cells that is borrowed from the technology of EEPROMs. In particular, depending on the specifications of the product, the designer of the memory has the possibility of cutting off only a few blocks of memory cells. These blocks will then have the function of an EEPROM that is erasable independently of the other memory cells, the rest of the memory cells being erasable in their totality. This is very important in practice because the large-scale manufacture of an integrated circuit such as a memory cannot be done under economically acceptable conditions unless only one technology is used. Indeed, the choice of this technology determines firstly the method of manufacture and secondly the level of the voltages to be generated in the circuit (for example by means of load pumps or frequency multipliers) to carry out all the possible operations (programming, erasure or reading operations).

However, it is observed that if, during a read operation, two depleted transistors are in the same group (in the above-mentioned sense of the term) of cells that are not selected (and whose control gates therefore receive a zero voltage), then the two corresponding bit lines are short-circuited. This corrupts the result of the read operation. This is why the erasure operation must be carried out with a great deal of precaution so as to prevent the erased transistors from getting into a depleted state. In practice, the operation of erasure then comprises, for each floating-gate transistor, the following four steps which come after a preliminary operation to program the entire memory zone concerned by the erasure:

first, the application to the terminals of the transistor, during a specified temporal window, of the voltages needed to enable its erasure by tunnel effect;

second, the testing of the erased state of the transistor, and a return to the first step if this is not the case;

third, the testing of the depleted state of the transistor (testing of the negative sign of the conduction threshold);

and fourth, if this is actually the case, the application to the terminals of the transistor, during a specific temporal window, of the required voltages to enable its reprogramming by hot carrier effect with a return to the third step for a fresh verification.

The operation of erasure is therefore delicate and lengthy in its implementation. This is why the memories using Flash EPROM technology have been further improved by the modification of the structure of the memory cells.

A memory cell thus modified is illustrated in FIG. 2, where the same elements as in FIG. 1 bear the same references. This structure is described in the article "A 128K Flash-EEPROM Using Double Polysilicon Technology" in the IEEE Journal of Solid State Circuits, Vol. SC-22, No. 5, October 1987. FIG. 2 shows only the four memory cells located at the intersection of the rows 0 and 1 on the one hand and the columns 0 and 1 on the other hand. Each floating-gate transistor TGFij has its source connected to the drain of a selection transistor TSij that is proper to it, the source of which is connected to a selection line SL common to all the memory cells of one column. Thus, the only difference with the structure of FIG. 1 lies in the fact that the source of each floating-gate transistor is connected to the selection line by means of a selection transistor that is proper to it instead of being common to the floating-gate transistors of the memory cells of the same group. This modified structure enables the floating-gate transistor of each memory cell to be insulated from the floating-gate transistors of the other memory cells. The result thereof is that the depleted or non-depleted state of the floating-gate transistor of the erased memory cells is not of vital importance. It is therefore no longer necessary to carry out the third and fourth steps stated here above during an operation of erasure, since whether the floating-gate transistor of the memory cells is in a depleted state or not is of no importance.

SUMMARY OF THE INVENTION

Briefly, according to the present invention, a method is provided which operates a non-volatile memory cell. The memory cell comprises a selection transistor and a floating-gate transistor. The source of the floating-gate transistor is connected to the drain of the selection transistor. The memory cell is programmable by hot carrier effect and erasable by tunnel effect. The method comprises the steps of applying a read voltage, and applying a bias voltage. The read voltage is applied to the control gate of the floating-gate transistor during an operation for reading the memory cell. The read voltage is substantially equal to a general supply voltage. The bias voltage is applied to the control gate of the selection transistor during an operation for reading the memory cell. The bias voltage is at least equal to the conduction threshold of the selection transistor.

Briefly, according to other aspects of the present invention, there are provided a memory which implements the above method, and a computer readable medium comprising instructions for implementing the above method.

BRIEF DESCRIPTION OF THE DRAWINGS

FIG. 1 shows the standard structure of a Flash EPROM type memory;

FIG. 2 shows a structure of a Flash EPROM type memory used according to the present invention;

FIG. 3 is a diagram showing the distribution of the threshold voltage of the floating-gate transistors in Flash EPROM technology in two states that are programmed or erased according to the prior art;

FIG. 4 is a diagram showing the distribution of the threshold voltage of the floating-gate transistors in Flash EPROM technology in two states that are programmed or erased according to an embodiment of the present invention; and FIG. 5 is a partial drawing of a memory according to an embodiment of the present invention.

DETAILED DESCRIPTION OF AN EMBODIMENT

1. Overview

Other features and advantages of the present invention shall appear from the following description. This description is given purely by way of illustration with reference to the appended drawings.

The present invention seeks to overcome this drawback of the prior art and, for this purpose, proposes a non-volatile memory cell programmable by hot carrier effect and erasable by tunnel effect, comprising a floating-gate transistor whose source is connected to the drain of a selection transistor. This memory cell structure is already described in the article "A 128K Flash-EEPROM Using Double Poly-silicon Technology" cited here above. According to the present invention, it is furthermore provided that the floating-gate transistor will be in a depleted state when the memory cell is in an "erased" state and that, during an operation for reading the memory cell, the control gate of the floating-gate transistor will receive a read voltage substantially equal to a general supply voltage which is in the range of 1.5 volts, the gate of the selection transistor then receiving a bias voltage at least equal to its conduction threshold so as to be conductive.

The present invention also relates to a non-volatile memory programmable by so-called hot carrier effect and erasable by tunnel effect, the memory cells of which are arranged in rows and columns and comprise a floating-gate transistor having its drain connected to a bit line common to all the memory cells of the same column, its control gate connected to a word line common to all the memory cells of the same row and its source connected to the drain of a selection transistor whose source is connected to a selection line common to all the memory cells of at least one column, wherein the floating-gate transistor is in a depleted state when the memory cell is in an "erased" state and wherein, during an operation for reading the memory cell, the row to which it belongs being selected by means of a row decoder in such a way that the corresponding word line is taken to a read voltage substantially equal to a general supply voltage that is in the range of 1.5 volts, the gates of the selection transistors of the memory cells of the selected row being simultaneously taken to a bias voltage sufficient to make them conductive.

Advantageously, the read voltage is therefore directly the general supply voltage, i.e. it no longer needs to be generated within the package by a voltage booster circuit from the general supply voltage. The read operation is therefore swift, or at least it is not penalized by the build-up time of the nominal value of a read voltage generated by a booster circuit.

2. Discussion

The present invention seeks to further improve the Flash EPROMs. In particular, it seeks to propose a structure and a mode of implementation of a memory cell according to this technology such that it has a read time that is as small as possible despite the use of a smaller supply voltage (in the range of 1.8 to 1.5 volts). Indeed, the present invention can be applied to memories designed for use at very low general supply voltages, typically of 1.5 volts. The expression "very low supply voltage" in the field of integrated circuits currently refers to a voltage below 2 volts, for example 1.8 volts or even 1.5 volts. The capacity of integrated circuits to be used at supply voltages of this level is a current preoccupation. Indeed, reducing this voltage makes it possible to reduce the electrical power dissipated in this circuit by Joule effect in the form of heat. This therefore enables a further reduction in the size of the integrated circuits. However, this will undoubtedly raise new problems as can be seen in referring also to FIG. 3.

This figure shows the statistical distribution of the conduction threshold VT of the floating-gate transistor of the memory cells according to the prior art. For the memory cells which are in the programmed state, this threshold is in the interval P between 5 and 7 volts with a peak around 6 volts. For the memory cells that are in the erased state, this threshold is in the interval E ranging from 0.5 to 3 volts with a peak around 2 volts. The read voltage that is applied to the control gate of the floating-gate transistor of the memory cells during a read operation is contained between these two intervals. In the prior art, this read voltage is in the range of 4.5 volts. It can be seen that the voltage of this type is greater than the general supply voltage when the latter is a very low voltage in the sense of term indicated here above. It must therefore be generated by a voltage booster circuit contained in the integrated circuit just as high programming or erasure voltages are generated by such means. Now, for reasons of current consumption, a booster circuit of this kind works only when the voltage that it generates is needed, i.e. in the case of the read voltage, only during a read operation. It is furthermore known that a booster circuit requires a certain amount of time after it has been put into operation to deliver its nominal output voltage. This lengthens the read time in the memory.

In the figures, the same references relate to the same elements. At adapted pins of the package, the integrated circuit memories receive first a general supply voltage (with a positive value) and second the ground voltage. In the present explanation, the potentials applied to the different terminals of the memory cells or of the other components in the memory are taken with reference to the ground. This is why reference is most usually made to voltages rather than to potentials.

The present invention relates to a memory cell with a structure described in the introduction, especially with reference to FIG. 2. It may be recalled that it comprises a floating-gate transistor whose source is connected to the drain of a selection transistor. A memory cell of this kind is non-volatile. It is programmable by hot carrier effect and erasable by tunnel effect (Fowler Nordheim effect). The programming mode and erasure mode are specified by the technology (namely the process) adopted which, as it happens, is that of so-called Flash EPROMs. This technology is characterized by a method of implantation, namely the doping of different zones with silicon and the insulation of these zones from one another, which is proper to this method. In particular, the oxide layer insulating the floating gate is far too thick to enable programming by tunnel effect, whence a programming of memory cells by hot carrier effect. A memory cell structure of this kind is known per se as has been stated above.

However, the present invention proposes the use of this memory cell with a known structure under novel conditions producing a technical effect by which it is possible to resolve the problem raised in the introduction.

On the one hand, the present invention proposes to ensure that the floating-gate transistor is in a depleted state when the memory cell is in an "erased" state. It is known that when a memory in integrated circuit form is delivered to the final user, all the memory cells are in the erased state. Consequently, according to the present invention, at delivery, all the floating-gate transistors are in the depleted state.

This is done simply in the following way. In an ultimate testing stage of the integrated circuit performed at the end of manufacture (testing after assembly in the package), several successive cycles of programming and erasure of the set of memory cells are carried out in order to ascertain the efficient operation of the memory through the different tests which do not need to be described in the present description. It will be noted only that it is enough to end this testing phase by a complete erasure of the memory, with a duration sufficient to eliminate all the negative charges contained in the floating gates and even to liberate a surplus of electrons so that the floating gates are charged positively. The floating-gate transistors of all the memory cells are then in the depleted state.

Subsequently, i.e. during erasure cycles prompted by the users (either for the purpose of erasure itself or prior to a write operation in the memory as is known), the voltages applied to the terminals of the floating-gate transistor of the memory cell to enable its erasure by tunnel effect are held for the period of a temporal window that is sufficient to obtain the same result. It is known that an erasure cycle lasts on an average 5 milliseconds depending on the initial charging state of the floating gate and depending on the intensity of the electrical field generated. With a temporal window of 7 milliseconds, for example, it may be considered with a high degree of certainty that the floating gate is positively charged.

In practice, an operation for the erasure of a memory cell comprises only two steps:
first, the application to the terminals of the floating-gate transistor, during said temporal window, of the voltages required to enable its erasure by tunnel effect;
second, the testing of the depleted state of the floating-gate transistor (testing of the negative sign of the conduction threshold).

Furthermore, the present invention proposes the use of the memory cells having a known structure with a particular reading convention presented here below with reference to FIG. 4. This figure shows the statistical distribution of the conduction threshold VT of the floating-gate transistor of the memory cells according to the present invention. For the memory cells that are in the programmed state, this threshold is in the interval P between 2 and 5 volts with a peak around 4 volts. For the memory cells that are in the erased state, this threshold is in the interval E between two negative values VTemin and VTemax, for example, respectively equal to –3 and –0.5 volts with a peak around –1.5 volts. The read voltage that is applied to the control gate of the floating-gate transistor of the memory cell during a read operation is included between these two intervals. According to the present invention, this read voltage has substantially the value of the general supply voltage of the package of the memory, i.e. it is in the range of 1.5 volts (a value of 1.8 volts, or even 2 volts at most, is also possible). This reading convention enables the direct use of the general supply voltage as the read voltage.

The digital values of the intervals of the conduction threshold in the programmed or erased state given here above have been given purely as an example of an embodiment. However the present invention remains applicable to memory cells whose conduction threshold, in the programmed state and in the erased state, is respectively greater or smaller than the values indicated.

Indeed, as stated here above, the present invention can be applied to memories designed for use at very low general supply voltages. This is why it is assumed that, with a threshold greater than 2 volts in the programmed state, the present invention can be validly applied since the read voltage (which according to the present invention is equal to the supply voltage) is then lower than this conduction threshold.

Furthermore, any negative value of the conduction threshold in the erased state is permissible inasmuch as it only expresses the fact that the floating-gate transistor is then in the depleted state. However, it is unnecessary to choose, for the erased state of the transistor, a negative threshold voltage that is very high in terms of absolute value inasmuch as this requires an erasure time that is all the longer and necessitates a level of consumption that is all the greater.

In short, the only thing that is important according to the present invention as regards the conduction threshold of the floating-gate transistor of the memory cells is that this threshold should be, first, greater than the value of the general supply voltage in the programmed state, and second, smaller than 0 volts (namely negative) in the erased state.

The two characteristics of use of a memory cell with a known structure according to the present invention as explained here above, namely that the floating-gate transistors of the memory cells are in a depleted state when said memory cell is in the erased state on the one hand and that the read voltage is equal to the general supply voltage (which is a very low supply voltage) on the other hand, therefore form a good combination inasmuch as the read voltage may be chosen to be equal to 0 volts, which means that it is possible to do without a booster to generate this read voltage.

It is quite clear that during an operation for reading the memory cell, the gate of the selection transistor receives a biasing voltage at least equal to its conduction threshold so as to be conductive. Since this transistor is a normally enhanced transistor, its conduction threshold is about 0.7 volts.

In a first possible embodiment of the present invention, the bias voltage received by the selection transistor gate is equal to the read voltage received by the control gate of the floating-gate transistor, i.e. it is about 1.5 volts or effectively higher than the conduction threshold.

However, the difference between the value of the read voltage and that of the conduction threshold of the selection transistor, namely 0.8 volts is also slightly low. Indeed, the selection transistor is thus again particularly resistive so that the read current, namely the current flowing in the bit line to which the memory cell is connected, is limited. Now, it is possible to increase the reading speed by increasing the value of the read current. This is why, in a preferred embodiment of the present invention, the bias voltage applied to the gate of the selection transistor during an operation for reading the memory cell is greater than the read voltage received by the control gate of the floating-gate transistor of said memory cell. Thus, the selection transistor is far less resistive. The result of this is that the bias voltage must be generated from the general supply voltage by means of a voltage booster circuit such as a load pump which brings the reader back to the above-mentioned drawbacks of these circuits with respect to read time. It will be understood that it is necessary to make a compromise in the choice of the level of the bias voltage with respect to the level of the general supply voltage, it being known that the higher this voltage, the greater is the read current and hence the faster is the read operation but that, conversely, the higher the current the greater is the extent to which the build-up of the bias voltage will be deferred and therefore the greater is the extent to which the read operation will be slowed down. It has been observed that a compromise of this kind is obtained when the bias voltage received by the gate of the selection transistor is about 3 volts.

The present invention also relates to a non-volatile memory programmable by hot carrier effect and erasable by tunnel effect (namely a Flash EPROM type memory) whose memory array comprises memory cells such as those described here above. FIG. 5 shows a partial diagram of a memory according to the present invention. In the memory array MM, the memory cells are arranged in rows Li and columns Cj where the indices i and j are integers. The structure of the memory cells is as described here above, i.e. they comprise a floating-gate transistor whose source is connected to the drain of a selection transistor. The drain of the floating-gate transistor is connected to a bit line BLj common to all the memory cells of the same column Gj and its control gate is connected to a word line WLi common to all the memory cells of the same row Li. The source of the selection transistor TSij is connected to a selection line SL common to all the memory cells of at least one column Cj.

According to the present invention, the floating-gate transistor TGFij is in a depleted state when the memory cell is in an "erased" state. Furthermore, during an operation for reading the memory cell, the row Li to which it belongs is selected by means of a row decoder XDEC in such a way that the -corresponding word line WLi is carried to a read voltage substantially equal to a general supply voltage Vcc which is about 1.5 volts, the gates of the selection transistors TSij of the memory cells of the selected row being simultaneously taken to a bias voltage Vpol sufficient to make them conductive.

According to a first embodiment, the gate of the selection transistor of a specified memory cell is connected to the word line to which the control gate of the floating-gate transistor of said memory cell is connected, so that the bias voltage is equal to the read voltage.

According to a preferred embodiment shown in FIG. 5, the gate of the selection transistor TSij of a given memory cell is connected to a control line LCi common to all the memory cells of the same line with a specific index i. For example, the gate of the selection transistor TS00 is connected to the control line LC0 common to all the memory cells of the row 0. Furthermore, during an operation for reading the memory cell, said control line is selected by a control line decoder and taken to a bias voltage at least equal to the conduction threshold of the selection transistor so as to make it conductive. In particular, the control line LCi is connected to the source of a control transistor TCi (for example referenced TC0 for the row 0) whose drain is connected to the output of a voltage booster circuit CPD which generates the bias voltage Vpol from the general supply voltage Vcc so that Vpol is greater than Vcc. A booster circuit of this kind is for example a load pump or a Schenkel-type voltage multiplier. As stated further above with respect to the memory cell according to the present invention, the bias voltage is preferably in the range of three volts.

Advantageously, the word line decoder and the control line decoder are the same row decoder XDEC for which each output Si is connected first to the gate of a line selection transistor TSLi whose source is connected to the corresponding word line WLi and whose drain is connected to the supply terminal to receive the general supply voltage Vcc, and second, to the gate of the control transistor TCi. Thus, the present invention does not require new means for the selection of the lines of the memory array MM.

Furthermore, according to preferred embodiments of the present invention, the level of the reading voltage is approximately 1.5 volts instead of zero. A reading voltage of approximately 1.5 volts (or even 1 volt) is the minimum voltage that allows having a threshold voltage of the floating-gate transistor close to zero by the negative values, while keeping a good reading speed. Because the threshold voltage is close to zero by the negative values, a simple test can be used to see if the floating-gate transistor is depleted, and only a single test is necessary. In particular, the test only requires a comparison of the threshold voltage to a potential of zero (which can always be found in the ground), and only the VTemax has to be tested.

Aspects of the present invention can be, at least partially, implemented by hardware, software, or a combination of both. Moreover, some of this functionality may be embodied in computer readable media such as 3.5 inch diskettes to be used in programming an information-processing apparatus to perform in accordance with the present invention. This functionality may also be embodied in computer readable media such as a transmitted waveform to be used in transmitting the information or functionality.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A non-volatile memory programmable by hot carrier effect and erasable by tunnel effect, the memory receiving a general supply voltage, said memory comprising:

a memory cell including:
　a selection transistor, and
　a floating-gate transistor, wherein the source of the floating-gate transistor is coupled to the drain of the selection transistor;

means for applying during an operation for reading the memory cell, at the control gate of the floating-gate transistor, the general supply voltage as a read voltage;

means for applying during the operation for reading the memory cell, at the gate of the selection transistor, a bias voltage which is at least equal to the conduction threshold of the selection transistor; and means for putting the floating-gate transistor in a depleted state when the memory cell is put in an erased state.

2. The memory as defined in claim 1, wherein the means for applying the general supply voltage includes a word line which is directly connected to the control gate of the floating-gate transistor, and the general supply voltage is selectively directly connected to the word line through a transistor.

3. The memory as defined in claim 1, wherein the control gate electrode of the floating-gate transistor overlays the floating gate electrode.

4. A non-volatile memory programmable by hot carrier effect and erasable by tunnel effect, the memory receiving a general supply voltage, said memory comprising:
   a memory cell including:
      a selection transistor; and
      a floating-gate transistor, wherein the source of the floating-gate transistor is coupled to the drain of the selection transistor;
   means for applying during an operation for reading the memory cell, at the control gate of the floating-gate transistor, the general supply voltage as a read voltage; and
   means for applying during the operation for reading the memory cell, at the gate of the selection transistor, a bias voltage which is at least equal to the conduction threshold of the selection transistor,
   wherein the general supply voltage is approximately 1.5 volts.

5. The memory as defined in claim 4,
   wherein the plurality of memory cells are arranged in rows and columns;
   the memory further includes:
      at least one bit line, wherein the floating-gate transistors of each memory cell in a column have their drains connected to a common bit line;
      at least one word line, wherein the floating-gate transistors of each memory cell in a row have their control gates connected to a common word line;
      at least one selection line, wherein the selection transistors of each memory cell in a column have their sources connected to a common selection line; and
      a word line decoder, wherein the word line decoder is coupled to each of the at least one word lines,
   the means for applying the general supply voltage at the control gate of one of the plurality of floating-gate transistors comprises the word line decoder, which selects the row to which the memory cell belongs by applying, to the corresponding word line, and
   the means for applying a bias voltage at the gate of one of the plurality of selection transistors comprises a means for simultaneously applying, to the gates of the selection transistors of the memory cells of the selected row, a bias voltage sufficient to make the selection transistors conductive.

6. The memory as defined in claim 5, wherein there is only one selection line, which is connected to the sources of the selection transistors of each memory cell.

7. The memory as defined in claim 5, wherein the means for simultaneously applying a bias voltage includes:
   at least one control line, wherein the at least one control line is coupled to the gates of the selection transistors of each memory cell in a given row; and
   a control line decoder, wherein the control line decoder is coupled to the control line, and selects the control line and applies a bias voltage at least equal to the conduction threshold of the selection transistors.

8. The memory as defined in claim 7, wherein the word line decoder includes the control line decoder.

9. The memory as defined in claim 7, further comprising:
   a voltage booster circuit, which generates the bias voltage from the supply voltage such that the bias voltage is greater than the supply voltage; and
   at least one control transistor, disposed between the at least one control line and the control line decoder,
   wherein the source of the at least one control transistor is coupled to the at least one control line,
   the gate of the at least one control transistor is coupled to the control line decoder, and
   the drain of the at least one control transistor is coupled to the output of the voltage booster circuit.

10. The memory as defined in claim 9, wherein the bias voltage is approximately three volts.

11. A non-volatile memory programmable by hot carrier effect and erasable by tunnel effect, the memory receiving a general supply voltage, said memory comprising:
    a memory cell including:
       a selection transistor; and
       a floating-gate transistor, wherein the source of the floating-gate transistor is coupled to the drain of the selection transistor;
    means for applying during an operation for reading the memory cell, at the control gate of the floating-gate transistor, the general supply voltage as a read voltage; and
    means for applying during the operation for reading the memory cell, at the gate of the selection transistor, a bias voltage which is at least equal to the conduction threshold of the selection transistor,
    wherein the means for applying a bias voltage which is at least equal to the conduction threshold of the selection transistor includes means for applying, during the operation for reading the memory cell, at the gate of the selection transistor, a bias voltage which is greater than the read voltage.

12. A non-volatile memory programmable by hot carrier effect and erasable by tunnel effect, the memory receiving a general supply voltage, said memory comprising:
    a memory cell including:
       a selection transistor; and
       a floating-gate transistor, wherein the source of the floating-gate transistor is coupled to the drain of the selection transistor;
    means for applying during an operation for reading the memory cell, at the control gate of the floating-gate transistor the general supply voltage as a read voltage; and
    means for applying during the operation for reading the memory cell, at the gate of the selection transistor, a bias voltage which is at least equal to the conduction threshold of the selection transistor,
    wherein the means for applying a bias voltage which is at least equal to the conduction threshold of the selection transistor includes means for applying, during the operation for reading the memory cell, at the gate of the selection transistor, a bias voltage which is approximately three volts.

13. A non-volatile memory programmable by hot carrier effect and erasable by tunnel effect, the memory receiving a general supply voltage, said memory comprising:
    a memory cell including:
       a selection transistor; and
       a floating-gate transistor, wherein the source of the floating-gate transistor is coupled to the drain of the selection transistor;

means for applying during an operation for reading the memory cell, at the control gate of the floating-gate transistor, the general supply voltage as a read voltage; and means for applying during the operation for reading the memory cell, at the gate of the selection transistor, a bias voltage which is at least equal to the conduction threshold of the selection transistor, wherein the means for applying the general supply voltage includes a word line which is connected to the control gate of the floating-gate transistor, and the means for applying a bias voltage also includes the word line, which is further connected to the gate of the selection transistor, such that the bias voltage is substantially equal to the read voltage.

14. A method of operating a non-volatile memory cell of a memory, the memory cell comprising a selection transistor and a floating-gate transistor whose source is connected to the drain of the selection transistor, the memory cell being programmable by hot carrier effect and erasable by tunnel effect, and the memory receiving a general supply voltage, said method comprising the steps of:

applying, during an operation for reading the memory cell, at the control gate of the floating-gate transistor, the general supply voltage as a read voltage;

applying, during the operation for reading the memory cell, at the gate of the selection transistor, a bias voltage which is at least equal to the conduction threshold of the selection transistor; and putting the floating-gate transistor in a depleted state when the memory cell is put in an erased state.

15. A method of operating a non-volatile memory cell of a memory, the memory cell comprising a selection transistor and a floating-gate transistor whose source is connected to the drain of the selection transistor, the memory cell being programmable by hot carrier effect and erasable by tunnel effect, and the memory receiving a general supply voltage, said method comprising the steps of:

applying, during an operation for reading the memory cell, at the control gate of the floating-gate transistor, the general supply voltage as a read voltage; and applying, during the operation for reading the memory cell, at the gate of the selection transistor, a bias voltage which is at least equal to the conduction threshold of the selection transistor, wherein the step of applying the general supply voltage includes selectively applying the general supply voltage, and the step of applying a bias voltage comprises:
generating a bias voltage which is greater than the read voltage; and
selectively applying the bias voltage.

16. A computer readable medium containing program instructions for operating a non-volatile memory cell of a memory, the memory cell comprising a selection transistor and a floating-gate transistor whose source is connected to the drain of the selection transistor, the memory cell being programmable by hot carrier effect and erasable by tunnel effect, and the memory receiving a general supply voltage, the program including instructions for:

applying, during an operation for reading the memory cell, at the control gate of the floating-gate transistor, the general supply voltage as a read voltage;

applying, during the operation for reading the memory cell, at the gate of the selection transistor, a bias voltage which is at least equal to the conduction threshold of the selection transistor; and putting the floating-gate transistor in a depleted state when the memory cell is put in an erased state.

17. A computer readable medium containing program instructions for operating a non-volatile memory cell of a memory, the memory cell comprising a selection transistor and a floating-gate transistor whose source is connected to the drain of the selection transistor, the memory cell being programmable by hot carrier effect and erasable by tunnel effect, and the memory receiving a general supply voltage, the program including instructions for:

applying, during an operation for reading the memory cell, at the control gate of the floating-gate transistor, the general supply voltage as a read voltage; and applying, during the operation for reading the memory cell, at the gate of the selection transistor, a bias voltage which is at least equal to the conduction threshold of the selection transistor, wherein the instructions for applying the general supply voltage include instructions for selectively applying the general supply voltage, and the instructions for applying a bias voltage include instructions for:
generating a bias voltage which is greater than the read voltage; and
selectively applying the bias voltage.

* * * * *